United States Patent [19]
Mullins et al.

[11] Patent Number: 5,592,124
[45] Date of Patent: Jan. 7, 1997

[54] INTEGRATED PHOTODIODE/TRANSIMPEDANCE AMPLIFIER

[75] Inventors: Edward Mullins; Rodney T. Burt; Walter B. Meinel; R. Mark Stitt, II, all of Tucson, Ariz.

[73] Assignee: Burr-Brown Corporation, Tucson, Ariz.

[21] Appl. No.: 494,413

[22] Filed: Jun. 26, 1995

[51] Int. Cl.[6] .................................................. H03F 3/08
[52] U.S. Cl. ........................ 330/308; 250/214 A; 330/300
[58] Field of Search .................................. 330/110, 252, 330/292, 300, 308; 250/214 A

[56] References Cited

U.S. PATENT DOCUMENTS

| | | | |
|---|---|---|---|
| 3,478,214 | 11/1969 | Dillman | 250/211 |
| 4,309,604 | 1/1982 | Yoshikawa et al. | 250/226 |
| 4,352,559 | 10/1982 | Gorgone et al. | 330/110 X |
| 4,462,002 | 7/1984 | Schade, Jr. | 330/253 |
| 4,535,233 | 8/1985 | Abraham | 250/214 |
| 4,563,656 | 1/1986 | Baum | 330/308 |
| 4,564,818 | 1/1986 | Jones | 330/311 |
| 4,609,880 | 9/1986 | Dermitzakis et al. | 330/308 |
| 4,626,675 | 12/1986 | Gündner | 250/211 |
| 4,761,549 | 8/1988 | Mealer et al. | 330/308 X |
| 4,780,625 | 10/1988 | Zobel | 307/350 |
| 4,888,562 | 12/1989 | Edler | 330/291 |
| 5,010,381 | 4/1991 | Shiba | 357/30 |
| 5,091,663 | 2/1992 | Ishizaki et al. | 330/253 |
| 5,105,145 | 4/1992 | Neth | 323/316 |
| 5,111,156 | 5/1992 | Hachiuma | 330/257 |
| 5,149,956 | 9/1992 | Norton | 250/211 |
| 5,216,386 | 6/1993 | Wyatt | 330/308 |
| 5,300,826 | 4/1994 | Okanobu et al. | 307/358 |
| 5,302,868 | 4/1994 | Fergus | 307/491 |
| 5,347,231 | 9/1994 | Bertuccio et al. | 330/300 |
| 5,373,182 | 12/1994 | Norton | 257/440 |

FOREIGN PATENT DOCUMENTS

| | | | |
|---|---|---|---|
| 57-155810 | 9/1982 | Japan | 330/260 |
| 62-18820 | 1/1987 | Japan | 327/52 |
| 62-115913 | 5/1987 | Japan | 327/52 |
| 0058189 | 3/1988 | Japan | 250/214 A |
| 63-121313 | 5/1988 | Japan | 327/52 |
| 0273021 | 11/1988 | Japan | 250/214 A |
| 2-196509 | 8/1990 | Japan | 327/52 |
| 3-286605 | 12/1991 | Japan | . |
| 6-77752 | 3/1994 | Japan | 330/260 |

OTHER PUBLICATIONS

"Rail–To–Rail In–And–Out IC OP Amps Run Off 2.7V", by Frank Goodenough, Electronic Design, May 16, 1994, pp. 51–65.

SSO–WS–7.56, Silicon Photonics, Detector Division of Janos Technology, Inc.

"Bipolar op amp achieves JFET–like speeds", by William F. Davis, Electronic Design, Sep. 1, 1983, pp. 145–150.

"Bipolar Innovations Provide Greater OP AMP Stability", by Julian Evans, New Electronics, May 28, 1985, pp. 50 & 53.

*Primary Examiner*—Steven Mottola
*Attorney, Agent, or Firm*—Cahill, Sutton & Thomas P.L.C.

[57] ABSTRACT

An integrated circuit photodetector includes a transimpedance amplifier including a differential amplifier stage with PNP emitter-coupled transistors and a PNP input transistor which are biased only by base currents of the emitter-coupled transistors, to achieve low input bias current. Low noise operation is achieved by bypass capacitors coupled between the bases and emitters of the input transistors, respectively. A constant current source supplies a current which develops a small pedestal voltage across a resistor to bias the non-inverting input of the transimpedance amplifier so as to avoid nonlinear amplification of low level light signals. A positively biased N-type guard tub surrounds the photodetector, which is formed in a junction-isolated N region on a P substrate, to collect electrons generated in the substrate by deep-penetrating IR light to prevent them from causing amplification errors. In one embodiment, a feedback network includes a resistor connected between the output of a buffer driven by the transimpedance amplifier and an inverting input thereof, and a capacitor connected between the output and inverting input of the transimpedance amplifier to provide low noise, fast settling operation.

18 Claims, 4 Drawing Sheets

INTEGRATED PHOTODIODE/TRANSIMPEDANCE AMPLIFIER

BACKGROUND OF THE INVENTION

The invention relates to improvements in photodetector circuits including a photodiode connected to an input of a transimpedance amplifier, and more particularly to improvements thereto which (1) produce both low noise and low input bias current in the input stage of the transimpedance amplifier, (2) avoid nonlinearity due to the presence of a "dead band" caused by offset of the differential input stage, (3) provide an N-type guard tub structure that collects current due to carrier generation caused by infrared or near infrared rays penetrating deeply into the semiconductor material of which the photodiode is fabricated, (4) allow application of an external pull-down voltage to levels below the chip substrate voltage, and (5) provide compensation as a function of transimpedance amplifier output voltage so as to reduce its NEP (noise effective power).

Figure 2:
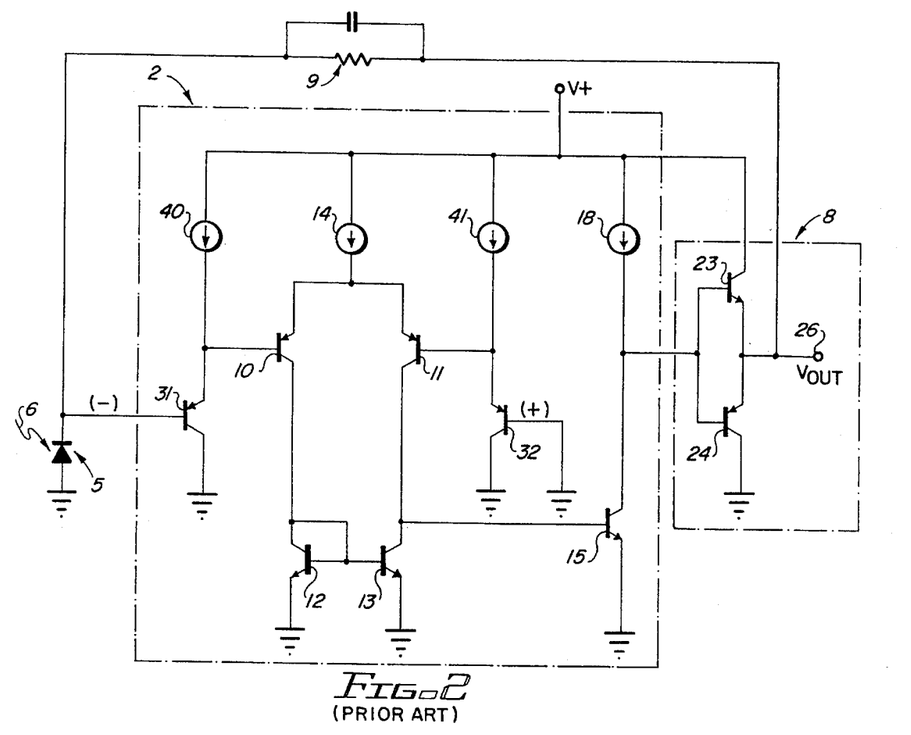
FIG. 2 is a simplified schematic diagram of a prior art transimpedance amplifier adapted for connection to a photodiode.

Photodetector circuits are often used in systems wherein high precision, linear low power circuits capable of operating from a single power supply are required. High performance photodetector circuits usually are constructed using a photodiode connected to the input of a transimpedance amplifier. It has been difficult to completely achieve such performance in an integrated photodiode/transimpedance amplifier which must have low input bias current, low input referred noise, is operable from a single power supply, and has an input common mode range which includes ground. FIG. 2 shows a typical prior art transimpedance amplifier of the type commonly used in a photodetector circuit, having a photodiode connected to the (−) input thereof. An input bias current source 40 is connected to the emitter of PNP input transistor 31. A bias circuit is connected to the base of PNP input transistor 32, or else the base of PNP input transistor 32 is connected to ground. In the prior art circuit of FIG. 2, the large bias currents applied by current sources 40 and 41 produce low values of $r_e$ in transistors 31 and 32. That results in low differential noise voltages between the bases of PNP differential amplifier input transistors 10 and 11, so the noise performance of the prior art circuit 2 of FIG. 2 is quite good.

However, bias current sources 40 and 41 of the prior art circuit of FIG. 2 supply large bias currents of 1 to 50 microamperes through PNP input transistors 31 and 32, which results in undesirably high input bias current.

The transimpedance amplifier circuit of FIG. 2 has an undesirable "dead band" of approximately 10 millivolts, which is the value of the typical "worst case" input offset voltage of the differentially coupled input transistors 10 and 11. Consequently, when the transimpedance amplifier of FIG. 2 is used with a photodiode to form a photodetector circuit, it is unresponsive to incident light until the light intensity reaches a level at which photodiode produces enough photocurrent to overcome the "dead band". The associated nonlinearity of the circuit is very undesirable. Nevertheless, the closest prior art single power supply photodetector circuits do not avoid the dead band problem.

An integrated circuit fabricated using a junction-isolated manufacturing process and a P-type substrate typically requires that the P-type substrate be connected to the most negative potential to ensure junction isolation between components fabricated in junction-isolated N-type epitaxial islands, and also to ensure that substrate junctions are never forward biased. In some applications it is desirable to be able to connect a load supplied by $V_{OUT}$ to a power supply which is more negative than ground, especially in transimpedance amplifiers designed to operate from a single power supply. The use of a pull-down load resistor connected between $V_{OUT}$ and the negative power supply voltage has the disadvantage that the current through such pull-down load resistor is proportional to the voltage across it. Depending on circuit operation, this can result in excessive power dissipation and also can overload the output NPN transistor 23 of buffer circuit 8 and thereby prevent linear circuit operation in response to the light 6 being detected by photodiode 5.

Figure 3:
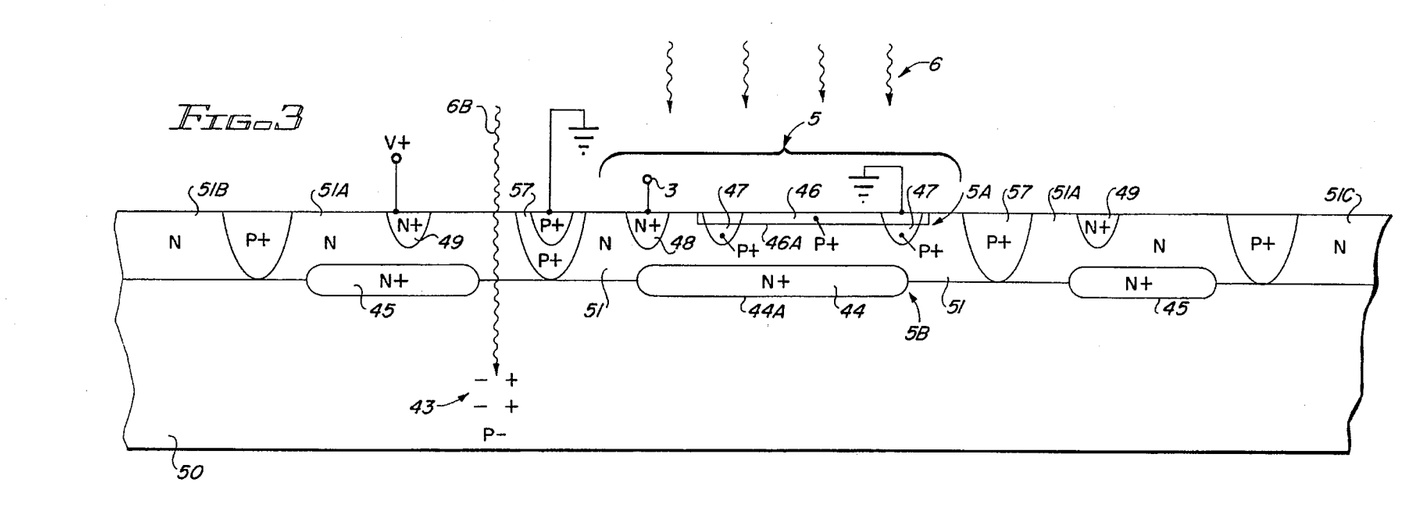
FIG. 3 is a partial sectional view of a semiconductor wafer showing the structure of an integrated circuit photodetector circuit including a photodiode and N-type guard tubs surrounding the photodiode, the integrated circuit photodetector also including a transimpedance amplifier.

A typical prior art structure in which a photodiode is fabricated can be understood by referring to a portion of FIG. 3, which shows part of the structure of the present invention. Typically, a lightly doped N-type epitaxial layer is formed on the upper surface of a P-type substrate 50. P+ isolation regions extend through the N-type epitaxial layer to form junction-isolated N-type regions in which isolated transistors, JFETs, and photodiodes can be formed. In a typical bipolar integrated circuit, a junction-isolated N-type epitaxial region functions as the collector of an NPN transistor or as the base of a lateral PNP transistor. In FIG. 3, photodiode 5 includes a shallow P+ ion-implanted region 46 which forms a photo junction with the underlying N⁻ epitaxial region 51. Light 6 impinging on this structure produces a first photocurrent. P+ contact diffusions 47 are provided to make it convenient to connect the P⁺ anode of the photodiode 5 to ground or the (+) input of transimpedance amplifier 2. An N+ buried layer region 44 is provided directly under P+ implanted region 46. An N+ region 48 provides for convenient connection of the cathode of the photodiode to the (−) input of transimpedance amplifier 2.

This much of the structure shown in FIG. 3 is conventional. Infrared or near infrared light 6 may impinge on the entire upper surface of the integrated circuit in which a photodiode, a transimpedance amplifier, and an output buffer are fabricated. Such impinging light 6 may include infrared or near infrared components, indicated by 6B in FIG. 3. Infrared or near infrared light, unlike ultraviolet light, penetrates deeply into the relatively thick P-type substrate 50, producing electron-hole pairs such as 43. Since P-type substrate 50 is lightly doped, these electron-hole pairs have long lifetimes, and therefore form currents, some of which are likely to be "collected" by the various N− epitaxial regions in which the bases of amplifier input transistors (such as 10, 11, 31 and 32 of FIG. 2) are formed, creating undesirable offset voltages. Such electron-hole pairs also may be collected by the N− epitaxial region 51 of photodiode 5, and thereby contribute an "error current" component that is summed with the photocurrents produced by the impinging light 6 to be detected unless something is done to prevent that from occurring.

Prior photodiode structures have included a first "top" photodiode located near the light-receiving surface of the chip and a second "bottom" photodiode having a photo junction located deeper within the semiconductor material. The "top" photodiode of such a structure is responsive to ambient visible light or ultraviolet light, and the "bottom" photo junction is responsive to deeper-penetrating infrared or near infrared light. The photocurrents generated by the two photodiodes have been applied as inputs to separate transimpedance amplifiers.

The "Noise Effective Power" (NEP) is a commonly used parameter for characterizing the performance of an optical detector. By definition, the NEP is the power that the input signal must have in order to produce an output signal that is equal to the RMS noise signal produced in the optical detector circuit. Stated differently, it is the power the input signal must have in order to cause the signal-to-noise ratio of the optical detector circuit to be equal to 1. It would be desirable to provide an optimal photodetector circuit having a lower NEP, which means that the photodetector circuit could detect weaker (i.e., lower amplitude) light signals.

It has been found that the structure of FIG. 3 provides a superior photodiode that is responsive to a much broader range of ambient light wavelengths than the closest prior art of which the inventors are aware, which prior art applies the photocurrents provided by the "top" and "bottom" photodiodes to the inputs of two separate transimpedance amplifiers, respectively.

SUMMARY OF THE INVENTION

Accordingly, it is an object of the invention to provide an integrated photodiode and transimpedance amplifier circuit which has low noise, low power consumption, and is operable from a single power supply.

It is another object of the invention to provide a transimpedance amplifier with low input bias current, low input referred noise, and operable from a single power supply.

It is another object of the invention to provide an integrated photodiode and transimpedance amplifier which is operable from a single power supply, is operable with low noise generation, and avoids the "dead band" associated with both amplifier input offset voltage and errors in the voltage developed across the feedback circuit by the input bias current in the closest prior art devices.

It is another object of the invention to provide an integrated photodiode and transimpedance amplifier in a junction-isolated integrated circuit structure which avoids errors caused by photocurrents resulting from deep-penetrating infrared or near infrared rays outside of the photodiode area of the integrated circuit structure.

It is another object of the invention to provide an integrated photodiode and transimpedance amplifier responsive to both visible and infrared or near infrared light.

It is another object of the invention to provide an optical detector having improved noise effective power (NEP) without degradation of settling time performance.

It is another object of the invention to provide an integrated photodiode and transimpedance amplifier wherein a load device can be connected to a power supply more negative than the substrate without excessive power dissipation and without exceeding any breakdown voltages of the integrated circuit structure.

Briefly described, and in accordance with one embodiment thereof, the invention provides an integrated circuit photodetector circuit including a transimpedance amplifier with a differential stage including first and second emitter-coupled transistors and an output circuit connected to drive an output amplifier, wherein first and second input transistors of the transimpedance amplifier have their emitters coupled to the bases of the first and second emitter-coupled transistors, respectively. The base currents of the first and second emitter-coupled transistors provide the only bias currents for the first and second input transistors, respectively. The base of the first input transistor is connected to an inverting input of the transimpedance amplifier, and the base of the second transistors connected to a non-inverting input thereof. In the described embodiment, the first and second emitter coupled transistors in the first and second input transistors are PNP transistors. First and second bypass capacitors are connected between the base and emitter of the first input transistor and between the base and emitter of the second input transistor, respectively. A photodiode has a first electrode connected to the inverting input and a second electrode coupled to the non-inverting input. The photodetector circuit has low input bias current because of the low bias currents in the emitters of the first and second input transistors, and provides low noise operation because of the low impedance coupling between the inverting and non-inverting inputs and the bases of the first and second emitter-coupled transistors, respectively. The photodetector circuit is operable from a single power supply.

In accordance with another embodiment of the invention, a "pedestal" bias voltage is applied to the non-inverting input of a transimpedance amplifier of the photodetector circuit, wherein such bias voltage is approximately equal to the sum of an input offset voltage between the inverting input and a ground supply voltage and a voltage developed across a feedback resistor. This prevents a "dead band" of the transimpedance amplifier from causing non-linearity of amplification by the photodetector circuit for values of the output voltage close to the ground supply voltage. In one embodiment, a JFET pull-down device has its source and gate connected to the output conductor of the photodetector circuit, thereby allowing a pull-down voltage lower than ground to be applied to the drain of the JFET, which then functions as a current limiter that limits power dissipation and prevents overloading of a pull-up transistor of the output amplifier.

In accordance with another embodiment of the invention, the invention provides an integrated circuit photodetector circuit including a first photodiode formed in a portion of an N-type epitaxial layer on a lightly doped P-type substrate. The portion is junction-isolated by a first P+ isolation ring. A second P-type isolation ring forms an N-type epitaxial "guard tub" surrounding the first P+ isolation region. The N– "guard tub" is connected to a supply voltage greater than the voltage of the substrate. Consequently, if infrared or near infrared light penetrates into the substrate outside of the photodiode area and generates free electrons, such free electrons strongly tend to flow to and be collected by the positively biased guard tub and therefore do not flow into the portion of N-type epitaxial layer in which the first photodiode is formed, and also do not flow into other junction-isolated portions of the N-type epitaxial layer in which transistors of a transimpedance amplifier are formed. This prevents errors from being introduced into photocurrent generated by the first photodiode and into the input stage of the transimpedance amplifier. A second photodiode is formed by an N+ buried layer between the substrate and the portion of the N-type epitaxial layer in which the first photodiode is formed. The first and second photodiodes are effectively connected in parallel, with their cathodes connected to the inverting input of the transimpedance amplifier and their anodes coupled (e.g., by a bias voltage circuit) to the non-inverting input thereof, providing a photodetector circuit which responds to light having a wide range of wavelengths, from infrared or near infrared to ultraviolet, with a single transimpedance amplifier.

In accordance with another embodiment, the invention provides a photodetector circuit including a transimpedance amplifier with inverting and non-inverting inputs and an output. An output amplifier is driven by the transimpedance amplifier. A photodiode is coupled between the inverting and non-inverting inputs. A feedback network includes a feedback resistor coupled between the inverting input of the transimpedance amplifier and the output of an output amplifier. The feedback network also includes a feedback capacitor coupled between the inverting input and the output of the transimpedance amplifier. A JFET pull-down device having its source and gate connected to the output of the output amplifier circuit and its drain connected to a reference voltage causes the gain of the output amplifier to be reduced to a value well below 1 for values of output voltage within a few hundred millivolts of the ground reference voltage. Such reduction in gain for low output voltages reduces both noise gain and closed loop bandwidth by making the feedback capacitance appear as if it were multiplied by the inverse of the output amplifier gain. The gain reduction occurs as a result of a decrease in the dynamic channel resistance of the JFET and an increase in the dynamic emitter resistance of a pull-up NPN transistor in the output amplifier at values of output voltage close to zero.

DETAILED DESCRIPTION OF THE PREFERRED EMBODIMENTS

Figure 1:
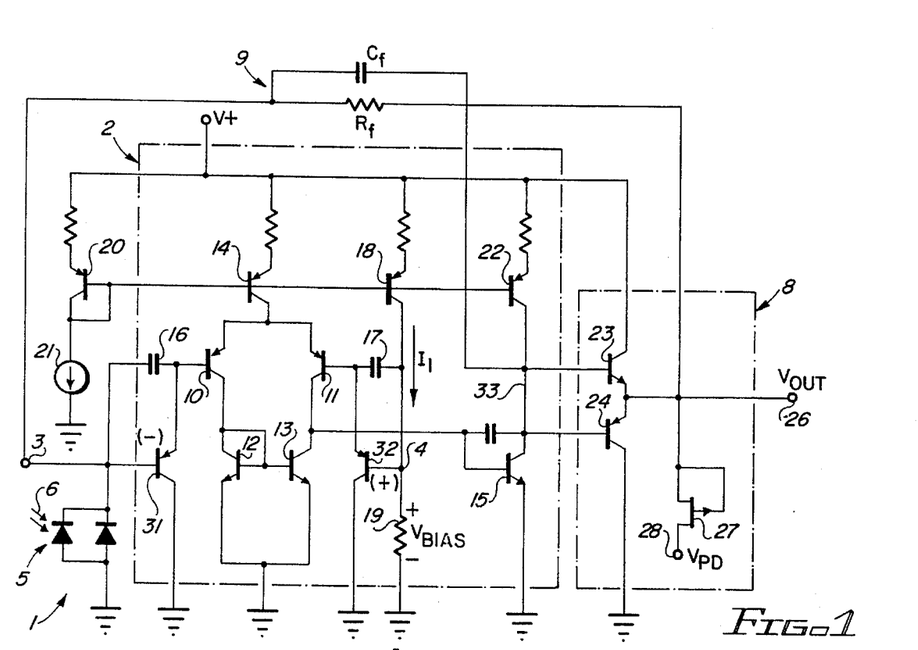
FIG. 1 is a simplified schematic circuit diagram of a preferred embodiment of the invention.

Referring to FIG. 1, photodetector circuit 1 detects light 6 impinging on photodiode 5, producing a photocurrent therein. Such photocurrent flows through the feedback network 9 to thereby produce a corresponding output voltage $V_{OUT}$ on conductor 26. Conductor 26 is the output of a unity gain buffer amplifier 8, the input of which is connected to conductor 33. Conductor 33 is connected to the output of transimpedance amplifier 2.

The basic structure shown in FIG. 1, including a photodiode, a transimpedance amplifier, and a buffer circuit, is well known in the prior art. Transimpedance amplifier 2 includes a current mirror circuit including a current source 21 connected to the base and a collector of a PNP control transistor 20 having its base and collector also connected to the bases of PNP constant current source transistors 14, 18 and 22, which have their emitters coupled to V+. Transistor 14 has its collector connected to the emitters of emitter-coupled PNP differential amplifier input transistors 10 and 11. The collectors of PNP transistors 10 and 11 are connected to the collectors of NPN load transistors 12 and 13, respectively, which form an NPN current mirror. The collector of transistor 12 is connected to the bases of transistors 12 and 13, the emitters of which are connected to ground. The collector of transistor 13 is connected to the base on NPN transistor 15, the emitter of which is connected to ground, and the collector of which is connected to conductor 33. Conductor 33 is connected to the collector of PNP current mirror output transistor 22. Buffer circuit 8 includes NPN pull-up transistor 23 having its collector connected to V+, its emitter connected to output conductor 26, and its base connected to conductor 33. PNP pull-down transistor 24 has its base connected to conductor 33, its emitter connected to conductor 26, and its collector connected to ground.

However, in the photodetector circuit 1 of FIG. 1, the input bias current sources 40 and 41 of the prior art circuit in FIG. 2 are omitted, and bypass capacitors 16 and 17 are connected between the base and emitter of PNP input transistor 31 and PNP input transistor 32, respectively.

The elimination of bias current sources 40 and 41 of the prior art circuit FIG. 2 significantly reduces the input bias current of the circuit because instead of having the previously mentioned bias currents of 1 to 50 microamperes flowing through PNP input transistors 31 and 32 as in the prior art circuit of FIG. 2, only the minute base currents of input PNP transistors 10 and 11 flow through the emitters of PNP input transistors 31 and 32, respectively. Such base currents are only approximately 50 nanoamperes, and result in very high dynamic emitter resistance $r_e$ are of transistors 31 and 32. Nevertheless, the circuit of FIG. 1 achieves approximately the same good "low noise performance" as the prior art circuit FIG. 2.

Since the quiescent current in input transistors 31 and 32 is substantially reduced compared to the bias or quiescent current in the corresponding input transistors in prior art FIG. 2, the frequency response of PNP input transistors 31 and 32 is degraded. However, bypass capacitors 16 and 17 feed the input signals from input conductors 3 and 4 directly to emitter-coupled PNP input transistors 10 and 11, thereby providing good frequency response for the circuit. Furthermore, bypass capacitors 16 and 17 improve input referred noise characteristics of the circuit. The result of the circuitry shown in FIG. 1, with bias current sources 40 and 41 in the prior art circuit of FIG. 2 omitted and bypass capacitors 16 and 17 provided as shown, provides a transimpedance amplifier that can operate from a single power supply, has low quiescent bias currents in the input transistors, operates with low noise, and has an input common mode voltage range that includes ground.

Such good low noise performance is achieved by the circuit of FIG. 1 even though the base currents of PNP input transistors 10 and 11 include large noise current components. Without bypass capacitors 16 and 17, such large noise current components would flow through the emitters of PNP input transistors 31 and 32, respectively, and hence would develop large noise voltages across the large dynamic emitter resistances $r_e$ of PNP input transistors 31 and 32. (The dynamic emitter resistances $r_e$ are large because they are inversely proportional to the small base currents of transistors 10 and 11 which serve as bias currents in the emitters of PNP input transistors 31 and 32. In contrast, in the prior art circuit of FIG. 2, the bias currents applied by current sources 40 and 41 are very large and therefore produce low values of $r_e$ in transistors 31 and 32, resulting in low differential noise voltages between the bases of PNP differential amplifier input transistors 10 and 11 and hence its above mentioned low-noise operation.)

The high values of $r_e$ of PNP transistors 31 and 32 ordinarily would tend to produce very large differential noise voltages between the bases thereof. However, at high frequencies bypass capacitors 16 and 17 provide very low impedances connected in parallel with the high dynamic emitter resistances $r_e$ of PNP input transistors 31 and 32. Therefore, at the high frequencies of most interest (e.g., 1 kilohertz and beyond), the noise current components of the base currents of PNP transistors 10 and 11 flow through the low impedances of bypass capacitors 16 and 17, respectively, and consequently the noise voltages generated between the bases of PNP transistors 10 and 11 are very low. Therefore, the high differential noise voltages which ordinarily would result from the high values of $r_e$ of transistors 31 and 32 are greatly reduced in the circuit of FIG. 1, while the low input bias current is very low as a result of the very low bias currents of transistors 31 and 32.

Figure 6:
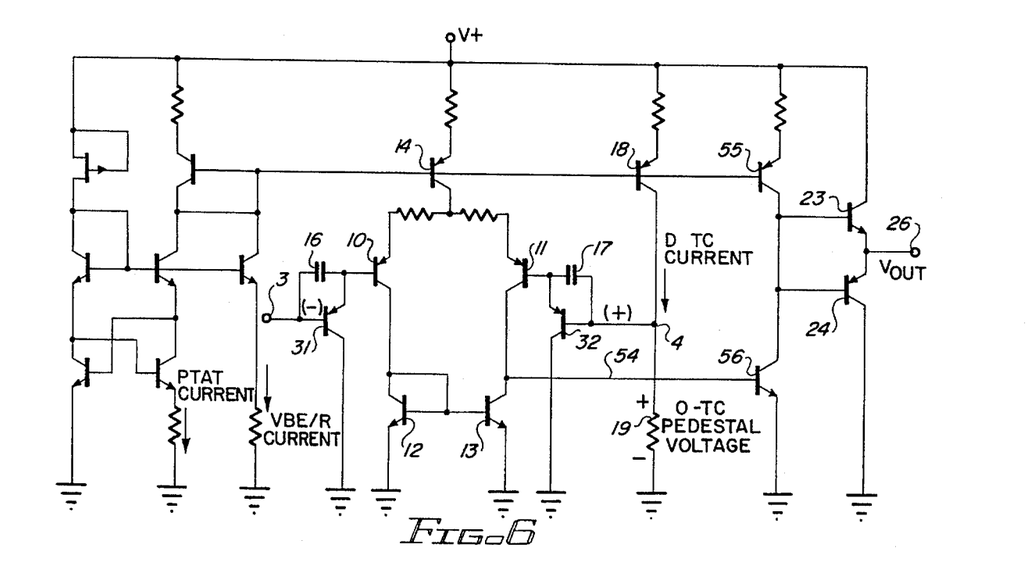
FIG. 6 is a more detailed schematic diagram of a preferred embodiment of the invention.

The preferred embodiment of transimpedance amplifier 2 is shown in the circuit of FIG. 6, and sums a "PTAT CURRENT" (Proportional To Absolute Temperature) with a "$V_{BE/R}$ CURRENT" to provide a current in constant current source transistor 18 with a temperature coefficient (T/C) near zero.

The circuitry in FIG. 1 includes constant current source transistor 18 connected to supply a current $I_1$ flowing through a resistor 19 to ground. The junction between the collector of constant current source transistor 18 and resistor 19 is connected to the (+) input conductor 4 of transimpedance amplifier 2. The value of the current $I_1$ and the value of resistor 19 are selected so that the bias voltage across resistor 19, referred to herein as a "pedestal voltage", is equal to the maximum expected input offset voltage of transimpedance amplifier 2, i.e., approximately 10 millivolts. Typical variations in the $V_{BE}$ voltages of PNP input transistors 10 and 11 and PNP input transistors 31 and 32 result in the sum of the input offset voltage ($V_{OFFSET}$) of transimpedance amplifier 2 and the voltage developed across the feedback resistor $R_F$ by the input bias current being typically in the range from 5 to 10 millivolts.

Figure 1A:
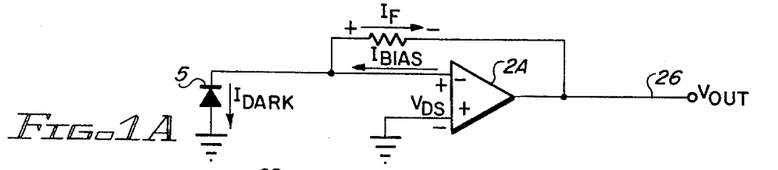
FIG. 1A is a circuit useful in explaining that applying a reference voltage a few millivolts greater than a ground voltage to the non-inverting input of a transimpedance amplifier of a photodetector circuit ensures linear circuit operation.

The reason the "pedestal voltage" $V_{BIAS}$ is desirable can be explained with reference to FIG. 1A. With no incident light impinging on photodiode 5, the only current flowing through photodiode 5 is the so called "dark current" $I_{DARK}$. An input bias current $I_{BIAS}$ flows out of the (−) input of transimpedance amplifier 2A. If transimpedance amplifier 2A has a PNP differential input stage, the common mode voltage range includes ground, so a feedback current $I_F$ will flow through feedback resistor $R_F$ in the direction indicated in FIG. 1A to equalize the voltages on the inverting and non-inverting inputs of transimpedance amplifier 2A. Typically, $I_{BIAS}$ will be a few nanoamperes, $R_F$ typically is a few megohms, and the input offset voltage of $V_{OS}$ of transimpedance amplifier 2A will be a few millivolts. This will tend to cause the output voltage $V_{OUT}$ on conductor 2C to swing below ground. However, the output of a typical single-supply transimpedance amplifier 2A, is not capable of swinging below ground. Consequently, a nonlinearity in amplification exists when $V_{OUT}$ is near ground. The addition of a few millivolts of a "pedestal" bias voltage as described above compensates for the input offset voltage of transimpedance amplifier 2A and the voltage developed across the feedback resistor by the input bias current, and therefore ensures linear operation when $V_{OUT}$ is near ground.

Without constant current source transistor 18 and resistor 19, i.e., with conductor 4 connected to ground, transimpedance amplifier 2 is likely to be completely unresponsive to the input light signal 6 impinging on photodiode 5 until the light intensity is such that the magnitude of the resulting photocurrent becomes large enough to overcome the 10 millivolt offset voltage. Stated differently, there is a large "dead band" of approximately 10 millivolts in the closest prior art transimpedance amplifiers in photodetector circuits. As mentioned above, the closest prior art single power supply photodetector circuits which are designed to operate from a single power supply do not attempt to solve this problem.

The input bias circuit including constant current source transistor 18 and resistor 19 selected to maintain the (+) input of transimpedance amplifier 2 at 10 millivolts above ground avoids the above mentioned "dead band" and provides linear detection and amplification of low intensity light signals.

The linearity of the circuit operation can be further improved by provision of JFET 27 with its drain connected to ground as shown in FIG. 1 so it draws a minimum amount of current through the emitter of output pull-up transistor 23 in buffer circuit 8. This, in combination with the 10 millivolt "pedestal" bias offset voltage superimposed on the (+) input conductor 4 helps provide the desired linear amplification and allows output current sinking of typical bias currents of additional signal processing circuits that may be connected to the output of photodetector circuit 1.

Apart from the advantages of JFET 27 in combination with the 10 millivolt "pedestal" bias offset voltage described above, JFET 27 can be very useful if the transimpedance amplifier 9 and buffer circuit 8 are operated between V+ and ground, and it is desirable that $V_{OUT}$ be pulled all the way to ground. PNP pull-down transistor 24 can only pull $V_{OUT}$ within a $V_{CESAT}$ of ground. For example, a simple charge pump circuit could be included on the same circuit which would apply a voltage to conductor 28 of JFET 27 so as to pull $V_{OUT}$ all the way to ground.

In FIG. 1, P-channel JFET 27 has its source and gate electrodes connected to $V_{OUT}$ conductor 26 and its drain 28 connected to an external pull-down voltage $V_{PD}$ that can be below ground. This feature is important in some applications wherein it is desirable to be able to connect a load supplied by $V_{OUT}$ to a power supply or pull-down voltage which is more negative than ground, especially in transimpedance amplifiers designed to operate from a single power supply, so the device can be conveniently operated with dual power supplies. Pull-down JFET 27 acts as a constant current source when $V_{PD}$ is more negative than $V_{OUT}$ minus the threshold voltage of JFET 27, thereby providing the desired negative pull-down current without overloading output transistor 23, or dissipating excessive power.

Figure 3A:
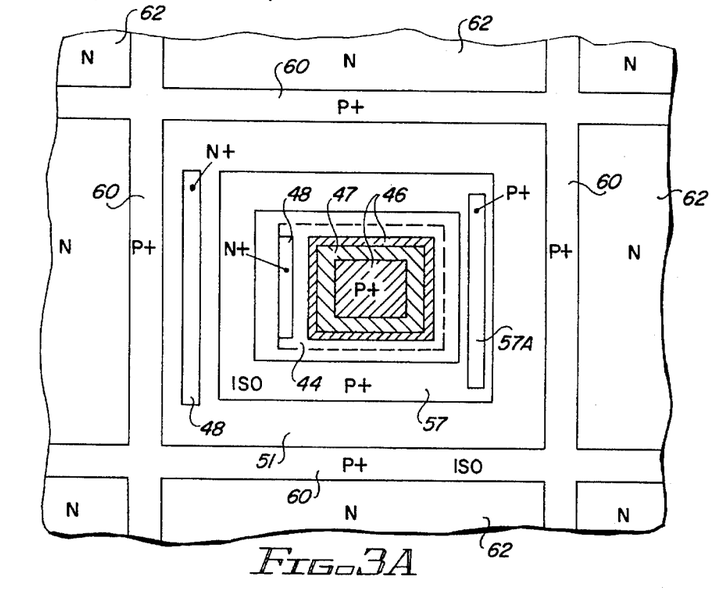
FIG. 3A is a partial plan view of the wafer shown in FIG. 3.

FIGS. 3 and 3A show the construction of photodiode 5 which is integrated into the same chip as transimpedance amplifier 2 and output buffer 8. Photodiode 5 includes a shallow P+ ion-implanted region 46 which forms a photo junction 46A with the underlying N− epitaxial region 51 which is junction-isolated from other N− epitaxial regions by an annular P+ isolation ring 57. Light 6 impinging on this structure produces a first photocurrent in photo junction 46A. P+ contact diffusions 47 provided convenient coupling (e.g., by a bias voltage source) of the P+ anode of photodiode 5 to the ground or the (+) input of transimpedance amplifier 2. An N+ buried layer region 44 is provided directly under P+ implanted region 46. An N+ region 48 provides for convenient connection of the cathode of the photodiode to (−) input of transimpedance amplifier 2.

In accordance with the present invention, an annular "guard ring tub" 51A of the N− epitaxial layer partly or completely surrounds the photodiode structure including P+ implanted region 46 and the junction-isolated epitaxial region 51 in which region 46 is formed. N+ region 49 is utilized to electrically connect N− guard ring tub 51A to the positive power supply V+, lightly doped P-type substrate 50 being connected to ground via a P+ contact region 57A formed in isolation ring 57. The components of transimpedance amplifier 2 and buffer amplifier circuit 8 are included in additional junction-isolated N− epitaxial regions such as 62 which are isolated from N− guard tub 51A by a P+ isolation ring 60.

In operation, the impinging light 6 to be detected strikes the entire upper surface of the integrated circuit in which photodiode 5, transimpedance amplifier 2, and output buffer 8 are fabricated. Such impinging light 6 may include infrared or near infrared components, indicated by 6B in FIG. 3. Infrared or near infrared light, unlike ultraviolet light, penetrates deeply into the relatively thick P-type substrate 50, producing electron-hole pairs such as 43. Since P-type substrate 50 is lightly doped, such electron-hole pairs 43 have long lifetimes, and therefore form electron currents which are "collected" by positive biased N− guard tub 51A, instead of being collected by various N-epitaxial regions in which the bases of amplifier input transistors 10, 11, 31 and 32 or the like are formed, or instead of being collected by the N− epitaxial region 51 of photodiode 5 to add on an error to the photocurrent generated thereby.

Therefore, the structure shown in FIG. 3 results in much more accurate detection and amplification of the detected light 6 than the prior art.

An additional advantage of the structure shown in FIG. 3 is that the N+ buried layer region 44 and the lightly doped P-type substrate actually form a second photo junction 44A which is, in effect, connected in parallel with the photo junction 46A of the "top" photodiode formed by between implanted P+ region 46 and N-epitaxial region 51. The photo junction 44A of the "bottom" photodiode formed by N+ buried layer region 44 and P-type substrate 50 is quite responsive to infrared or near infrared light, and therefore produces a second photocurrent that is summed with the first photocurrent generated by the photo junction 46A between P+ implanted region 46 and N− epitaxial region 51. The summed first and second currents then flow into N+ contact region 48 from the feedback network 9.

Figure 3B:
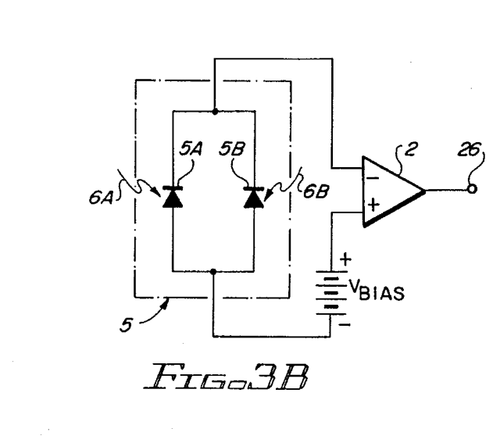
FIG. 3B is a partial schematic diagram illustrating the photodiode of FIG. 3 connected between the inverting and non-inverting inputs of the transimpedance amplifier shown in FIG. 1.

FIG. 3B schematically shows the "composite" photodiode 5 including "top" photodiode 5A and "bottom" photodiode 5B connected in parallel between the (+) and (−) inputs of transimpedance amplifier 2. In FIG. 3B, numeral 6B designates the impinging infrared or near infrared component of the detected light 6, and numeral 6A designates impinging light of all other wavelengths.

It has been found that the structure of FIG. 3 provides a superior photodiode that is responsive to a much broader range of ambient light wavelengths than the closest prior art of which the inventors are aware, which prior art applies the photocurrents provided by the "top" and "bottom" photodiodes to the inputs of two separate transimpedance amplifiers, respectively.

Figures 4, 4A:
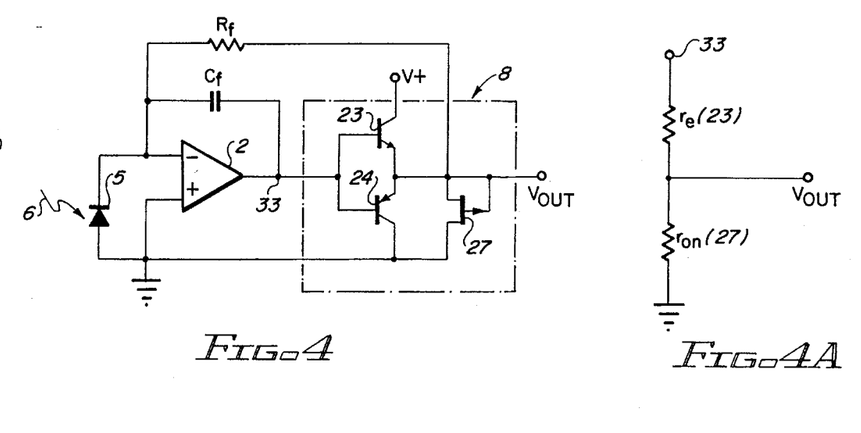
FIG. 4 is a schematic diagram illustrating a circuit that minimizes noise effective power (NEP) in response to changes in the output voltage of the transimpedance amplifier.
FIG. 4A is a simplified circuit diagram useful in explaining the operation of the circuit shown in FIG. 4.

In another embodiment of the invention, the feedback circuit 9 shown in FIG. 2, in which both the feedback capacitor $C_f$ and the feedback resistor $R_f$ are connected between the (−) input 3 of transimpedance amplifier 2 and the output 26 of buffer circuit 8, is modified as shown in FIG. 4. In FIG. 4, $R_f$ is connected the same as in FIG. 2, but $C_f$ is connected between the output 33 of transimpedance amplifier 2 and the (−) input thereof.

The improvement shown in FIGS. 4 and 4A–C, including connecting the drain of JFET 27 to ground, improves the previously mentioned "Noise Effective Power" (NEP) of an optical detector circuit.

It can be shown that the effect of compensation of a feedback loop to a node (e.g., node 33) which has variable gain is to provide closed loop bandwidth and noise gain which are controlled by the gain of the output buffer 8. In the circuit shown in FIG. 4, the gain of output buffer 8, which includes NPN transistor 23, PNP transistor 24, and JFET 27, is controlled as a function of the output voltage $V_{OUT}$.

If the gain of output stage 8 is reduced, both the "noise gain" and the open loop bandwidth are reduced. This can be intuitively understood by recognizing that the feedback capacitance $C_f$ is effectively being multiplied by the inverse of the gain of buffer circuit 8. That results in reduced output noise, thereby reducing (and hence improving) the noise effective power NEP. The equivalent circuit of the dynamic emitter resistance $r_e$ of transistor 23 and the "on" resistance $r_{on}$ of JFET 27 is shown in FIG. 4A. It can be readily seen that as $V_{OUT}$ increases, $r_e$ rapidly falls, and the gain of the emitter follower transistor 23 increases from less than 0.5 to 1 as $V_{OUT}$ increases from zero to beyond about 0.2 volts.

Figure 5:
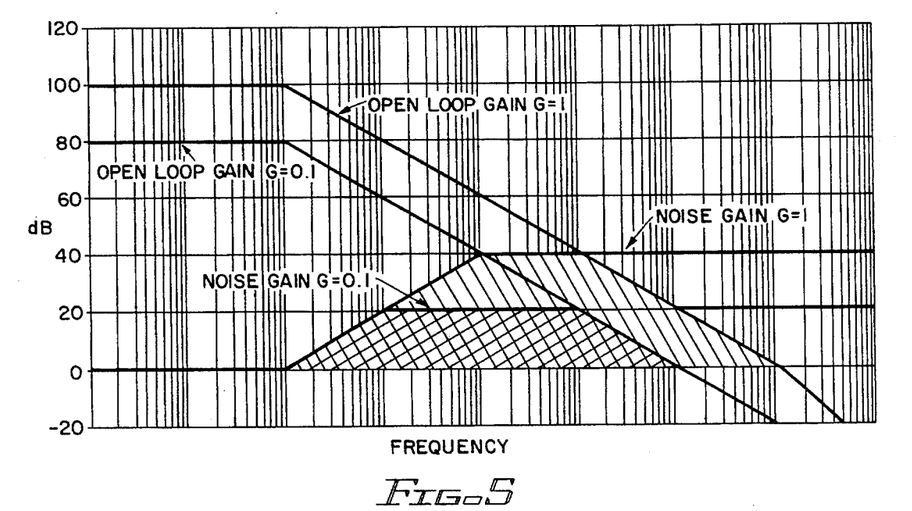
FIG. 5 is a graph which illustrates the noise gain and open loop gain of the circuit of FIG. 4 as a function of the output stage gain, and also illustrates the resulting reduced output noise voltage.

FIG. 5 shows the noise gain and open loop gain as functions of output stage gain. Notice that for values of output stage gain G less than 1, both noise gain and open loop bandwidth are reduced. This results in lower output noise voltage. Note that the output noise voltage is proportional to the area bounded by the noise gain and open loop curves. The lower output noise voltage effectively lowers the NEP.

Figure 4B:
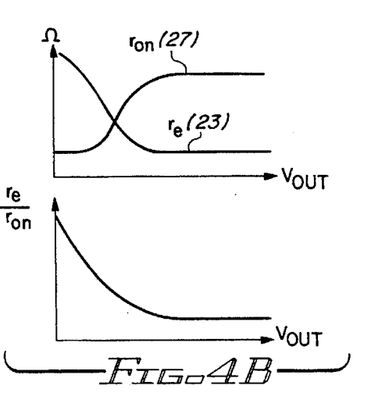
FIG. 4B is another diagram useful in explaining the operation of the circuit of FIG. 4.

FIG. 4B illustrates the values of $r_{on}$ and $r_e$ as a function of $V_{OUT}$ and also illustrates the ratio of $r_e/r_{on}$ verses $V_{OUT}$. Another intuitive way of understanding why the circuit of FIG. 4 reduces the bandwidth at low values of $V_{OUT}$ so as to substantially improve the noise performance is to recognize that low values of gain of buffer stage 8 cause the capacitance $C_f$ to appear to be much larger in value, so it essentially acts as a filter that reduces noise from the input stage.

Figure 4C:
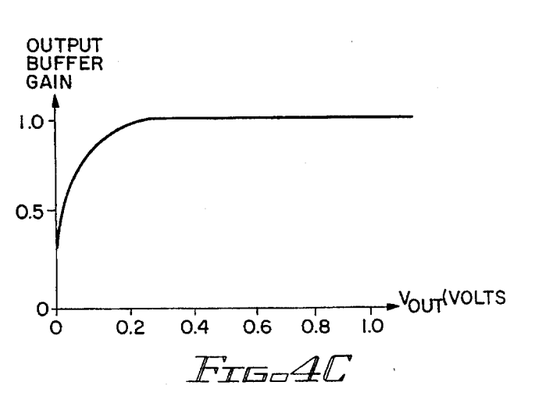
FIG. 4C is a graph useful in explaining the operation of the circuit of FIG. 4.

FIG. 4C shows the gain of buffer circuit 8 as a function of $V_{OUT}$. Specifically, for very low values of $V_{OUT}$, the gain of output buffer 8 is considerably less than 1, and approaches 1 as $V_{OUT}$ exceeds 0.2 volts. This occurs because when $V_{OUT}$ is near zero volts, the drain current through JFET 27 is nearly zero. Consequently, the emitter current of NPN transistor 23 is also nearly zero, so its dynamic resistance $r_e$ is very high.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention.

For example, the substrate 50 in FIG. 3 could be N-type instead of P-type, and the conductivity types of the other layers illustrated in this structure could be reversed. Furthermore, the photodiode structure shown in FIG. 3 could be provided on an integrated circuit wafer with circuitry other than transimpedance amplifier 2 and output buffer 8. For example, the photodiode structure could be connected to a comparator or to the input of an analog-to-digital converter, voltage-to-frequency converter circuit, or other signal processing circuitry integrated onto the same semiconductor chip as the photodiode structure 5. The constant current source PNP transistor 14 in FIG. 1 could be replaced by a JFET with its gate and source connected to the emitters of input transistors 10 and 11 and a drain coupled to V+. The feedback resistor $R_f$ can be connected to a different conductor than $V_{OUT}$ as long as the conductor carries a voltage which represents reduced gain of the output buffer as $V_{OUT}$ decreases to values very close to ground. In the structure shown in FIG. 3A, additional photodiodes such as the one shown in junction-isolated N-type epitaxial region 51 could also be included in one or more of the N-type junction-isolated epitaxial regions 62. The disclosed guard tub structure could be useful on a chip that includes an array of such photodiode structures, with no other circuitry being integrated onto the same chip. In such a photodiode array, the positively or zero biased N-type guard tubs would reduce cross talk between photodiodes.

What is claimed is:

1. A photodetector circuit comprising in combination:
    (a) a transimpedance amplifier including a differential stage having first and second emitter-coupled transistors, and having an inverting input, a non-inverting input, and an output;
    (b) an output amplifier circuit having an output on which an output voltage is produced and also having an input connected to the output of the transimpedance amplifier;
    (c) an input circuit in the transimpedance amplifier including
        i. a first input transistor having an emitter coupled to a base of the first emitter-coupled transistor, a collector coupled to a first reference voltage conductor and a base coupled to the inverting input, and a second input transistor having an emitter coupled to a base of the second emitter-coupled transistor, a collector coupled to the first reference voltage conductor, and a base coupled to the non-inverting input, and
        ii. a first bypass capacitor coupled between the emitter and the base of the first input transistor;
    (d) a feedback network coupled to the inverting input and the output of the output amplifier circuit; and
    (e) a photodiode having a first electrode coupled to the inverting input and a second electrode coupled to the first reference voltage conductor.

2. The photodetector circuit of claim 1 further including a second bypass capacitor coupled between the emitter and the base of the second input transistor.

3. The photodetector circuit of claim 1 wherein the feedback network includes a feedback resistor coupled between the inverting input and the output of the output amplifier circuit, and a feedback capacitor coupled between the inverting input and the output of the transimpedance amplifier.

4. The photodetector circuit of claim 1 wherein the first and second emitter-coupled transistors and the first and second input transistors are PNP transistors.

5. The photodetector circuit of claim 4 wherein the transimpedance amplifier includes a first constant current source transistor having a first current-carrying electrode coupled to the emitters of the first and second emitter-coupled transistors and a second current-carrying electrode coupled to a second supply voltage conductor.

6. The photodetector circuit of claim 5 wherein the first constant current source transistor is a PNP transistor having a collector coupled to the emitters of the first and second emitter-coupled transistors and an emitter coupled to a second supply voltage conductor.

7. The photodetector circuit of claim 5 wherein the transimpedance amplifier includes a first NPN load transistor coupled between a collector of the first emitter-coupled transistor and the first supply voltage conductor and a second NPN load transistor coupled between a collector of the second emitter-coupled transistor and the first supply voltage conductor.

8. The photodetector circuit of claim 7 wherein the transimpedance amplifier includes an output stage including a PNP current source transistor and an NPN amplifier transistor having an emitter coupled to the first supply voltage conductor, a base coupled to the second NPN load transistor, and a collector coupled to a collector of the PNP constant current source transistor and to the output of the transimpedance amplifier.

9. The photodetector circuit of claim 1 wherein the output amplifier circuit includes an NPN pull-up transistor having a base coupled to the input of the output amplifier circuit, an emitter coupled to the output of the output amplifier circuit, and a collector coupled to the second supply voltage conductor, and a PNP pull-down transistor having a base coupled to the input of the output amplifier circuit, an emitter coupled to the output of the output amplifier circuit, and a collector coupled to the first supply voltage conductor.

10. The photodetector circuit of claim 1 including a pull-down JFET having a source and gate coupled to the output of the output amplifier circuit and a drain coupled to an external pull-down terminal which is adapted to receive an external pull-down voltage equal to or lower than the voltage of the first supply voltage conductor.

11. The photodetector circuit of claim 1 including a bias circuit supplying a bias voltage that is approximately equal to the sum of a voltage developed across the feedback network by an input offset current flowing therein and an input offset voltage between the inverting and non-inverting inputs of the transimpedance amplifier, so that a dead band caused by the input offset voltage of the transimpedance amplifier and the voltage developed across the feedback circuit does not result in a non-linearity in amplification by the photodetector circuit for low light intensities resulting in values of the output voltage close to the voltage of the first supply voltage conductor.

12. A photodetector circuit comprising in combination:
    (a) a transimpedance amplifier including a differential stage having first and second emitter-coupled transistors, and having an inverting input, a non-inverting input, and an output;
    (b) an input circuit in the transimpedance amplifier including
        i. a first input transistor having an emitter coupled to a base of the first emitter-coupled transistor, a collector coupled to a first reference voltage conductor and a base coupled to the inverting input, and a second input transistor having an emitter coupled to a base of the second emitter-coupled transistor, a collector coupled to the first reference voltage conductor, and a base coupled to the non-inverting input, and ii. a first bypass capacitor coupled between the emitter and the base of the first input transistor;

(c) a feedback network coupled to the inverting input and the output of the transimpedance amplifier; and (d) a photodiode having a first electrode coupled to the inverting input and a second electrode coupled to the first reference voltage conductor.

13. A transimpedance amplifier comprising in combination:

(a) a differential stage having first and second emitter-coupled transistors, and having an inverting input, a non-inverting input, and an output;

(b) an input circuit in the transimpedance amplifier including i. a first input transistor having an emitter coupled to a base of the first emitter-coupled transistor, a collector coupled to a first reference voltage conductor and a base coupled to the inverting input, and a second input transistor having an emitter coupled to a base of the second emitter-coupled transistor, a collector coupled to the first reference voltage conductor, and a base coupled to the non-inverting input, and ii. a first bypass capacitor coupled between the emitter and the base of the first input transistor; and (c) a photodiode having a first electrode coupled to the inverting input and a second electrode coupled to the first reference voltage conductor.

14. The transimpedance amplifier of claim 13 further including a second bypass capacitor coupled between the emitter and base of the second input transistor.

15. An amplifier comprising in combination:

(a) a differential amplifier coupled to a single power supply and adapted to receive supply voltage power only from the single power supply, the single power supply providing a ground voltage and a positive supply voltage;

(b) an output stage having an input coupled to an output of the differential amplifier, the output stage including a bipolar pullup transistor and a bipolar pulldown transistor, the output stage having an output coupled to the bipolar pull-up transistor and the bipolar pulldown transistor; and (c) a pull-down JFET having a source and gate coupled to the output of the output stage and a drain coupled to a pull-down terminal adapted to receive a pull-down voltage equal to or below the ground voltage.

16. A photodetector circuit comprising in combination:

(a) a transimpedance amplifier having an inverting input, a non-inverting input, and an output;

(b) an output amplifier circuit having an output and also having an input coupled to the output of the transimpedance amplifier;

(c) a photodiode coupled between the inverting and non-inverting inputs of the transimpedance amplifier; and (d) a feedback network including a feedback resistor coupled between the inverting input of the transimpedance amplifier and the output of the output amplifier circuit, and a feedback capacitor coupled between the inverting input and the output of the transimpedance amplifier.

17. The photodetector circuit of claim 16 wherein the output amplifier circuit includes an NPN pull-up transistor having a base coupled to the input of the output amplifier circuit, an emitter coupled to the output of the output amplifier circuit, and a collector coupled to a first supply voltage conductor, and a pull-down JFET having a source and gate coupled to the output of the output amplifier circuit and a drain coupled to the second supply voltage conductor, whereby the gain of the output amplifier circuit increases from a value substantially less than one for values of output voltage on the output of the output amplifier circuit very close to the voltage of the second supply voltage conductor to nearly one for values of output voltage of the output amplifier circuit greater than a few tenths of a volt above the voltage of the second supply voltage conductor.

18. The photodetector circuit of claim 17 further including a PNP pull-down transistor having a base coupled to the input of the output amplifier circuit, an emitter coupled to the output of the output amplifier circuit, and a collector coupled to the second supply voltage conductor.

* * * * *